(12) United States Patent
Steedman et al.

(10) Patent No.: US 7,589,568 B2
(45) Date of Patent: Sep. 15, 2009

(54) VARIABLE POWER AND RESPONSE TIME BROWN-OUT-RESET CIRCUIT

(75) Inventors: Sean Steedman, Phoenix, AZ (US); Ruan Lourens, Cedar Park, TX (US); Richard Hull, Puyallup, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 123 days.

(21) Appl. No.: 11/744,365

(22) Filed: May 4, 2007

(65) Prior Publication Data

US 2008/0272830 A1 Nov. 6, 2008

(51) Int. Cl.
*H03K 5/22* (2006.01)
(52) U.S. Cl. ............................. 327/77; 327/88; 327/143
(58) Field of Classification Search ........................ None
See application file for complete search history.

(56) References Cited

U.S. PATENT DOCUMENTS

| | | | | |
|---|---|---|---|---|
| 5,283,762 A | * | 2/1994 | Fujishima | 365/189.09 |
| 5,378,936 A | * | 1/1995 | Kokubo et al. | 327/77 |
| 5,943,635 A | * | 8/1999 | Inn | 702/60 |
| 6,008,674 A | * | 12/1999 | Wada et al. | 327/89 |
| 6,147,521 A | * | 11/2000 | Degoirat et al. | 327/81 |
| 6,236,249 B1 | * | 5/2001 | Choi et al. | 327/143 |
| 6,522,981 B2 | * | 2/2003 | Smit et al. | 702/60 |
| 2005/0280450 A1 | | 12/2005 | Shin et al. | |

OTHER PUBLICATIONS

International Search Report and Written Opinion for PCT/US2008/062470 mailed Jul. 23, 2008.

* cited by examiner

*Primary Examiner*—Tuan Lam
(74) *Attorney, Agent, or Firm*—King & Spalding LLP (57) ABSTRACT

A brown-out-reset circuit having programmable power and response time characteristics. These characteristics may be programmed over an n-bit wide bus for $2^n$ different characteristics ranging from very low power consumption and slower response time to very fast response time and higher power consumption. A serial one wire bus may be used instead of the n-bit wide bus.

31 Claims, 4 Drawing Sheets

VARIABLE POWER AND RESPONSE TIME BROWN-OUT-RESET CIRCUIT

TECHNICAL FIELD

The present disclosure relates to semiconductor integrated circuit brown-out-reset circuits, and more particularly, to a variable power and response time brown-out-reset circuit whose power requirement and response time characteristics are programmable.

BACKGROUND

Electronic devices comprising electronic analog, digital and/or mixed-mode circuits of an integrated circuit may require a certain minimum threshold voltage for proper operation. When a power source for these devices is below a critical operating voltage (e.g., "brown-out"), the circuits of a device may be in unpredictable "meta-stable" states and electrically noisy environments may further degrade operation of the device circuits when trying to operate below the critical operating voltage. A brown-out is considered to have occurred when the incoming voltage available to a device, e.g., microprocessor, has dropped to a level where the device should not continue operating, since errors or partly functional conditions may occur in its logic or storage elements. The brownout ends when the voltage has risen back above the brownout level. Electronic circuits have been used to monitor the voltage of a power source to an electronic device in order to detect a required voltage threshold in generating a brown-out-reset ("BOR") for the digital logic of the electronic device. A brownout detector detects when the operating voltage has dropped to just above the brownout voltage level and produces a signal to indicate to the electronic device that a brownout is pending. The brownout signal may initiate a reset or freeze the operation of the electronic device in order to avoid improper operation thereof.

Typically BOR circuits require a quiescent current at all times in order to function. For low power or battery operated electronic devices, this quiescent current is a significant factor in the reduction of battery life, particularly for electronic devices that are expected to be operable for extended periods of time, e.g., devices operating at very low power levels when in a sleep mode. Thus, it is preferred that the quiescent current for a BOR circuit be held to a minimum for longest battery operation. On the other hand, however, it is also very important to prevent high speed digital logic from going into a BOR condition while mistakenly executing program instructions before the BOR signal is recognized and available for deactivation of the appropriate internal circuitry of the digital logic. This condition may potentially cause an electronic device failure because program instructions may be accessed and executed when the device is not operating within its proper voltage specifications.

SUMMARY

Therefore what is desired is a brown-out-reset (BOR) circuit that may be configurable so as to operate with minimal current consumption when an electronic device is in a sleep or low power mode, or at sufficient response speed when the electronic device is operating in a high speed mode.

According to a specific example embodiment of this disclosure, a variable power and response time brown-out-reset apparatus may comprise: a comparator having a first input, a second input and an output; a comparator bias circuit coupled to the comparator, wherein the comparator bias circuit is adapted to programmably change the comparator speed and power usage characteristics; a fixed voltage reference having an output, wherein the output of the fixed voltage reference is coupled to the first input of the comparator, wherein the fixed voltage reference has programmable speed and power characteristics; a power source voltage divider having an input and an output, wherein the input of the power source voltage divider is coupled to a power source and the output of the power source voltage divider is coupled to the second input of the comparator, wherein the power source voltage divider has programmable speed and power characteristics; and a n-bit wide power control bus coupled to the comparator bias circuit, the fixed voltage reference and the power source voltage divider, wherein the speed and power usage characteristics of the comparator, the fixed voltage reference and the power source voltage divider are programmed over the n-bit wide power control bus; wherein if a reference voltage from the output of the fixed voltage reference is greater than a divided power source voltage from the output of the power source voltage divider, then a logic level changes on the output of the comparator.

According to another specific example embodiment of this disclosure, a variable power and response time brown-out-reset apparatus may comprise: a comparator having a first input, a second input and an output; a comparator bias circuit coupled to the comparator, wherein the comparator bias circuit is adapted to programmably change the comparator speed and power usage characteristics; a programmable voltage reference having an output, wherein the output of the programmable voltage reference is coupled to the first input of the comparator, wherein the programmable voltage reference has programmable speed and power characteristics, and reference voltage values; a power source voltage divider having an input and an output, wherein the input of the power source voltage divider is coupled to a power source and the output of the power source voltage divider is coupled to the second input of the comparator, wherein the power source voltage divider has programmable speed and power characteristics; and a n-bit wide power control bus coupled to the comparator bias circuit, the programmable voltage reference and the power source voltage divider, wherein the speed and power usage characteristics of the comparator, the programmable voltage reference and the power source voltage divider are programmed over the n-bit wide power control bus; wherein if a reference voltage from the output of the programmable voltage reference is greater than a divided power source voltage from the output of the power source voltage divider, then a logic level changes on the output of the comparator.

According to yet another specific example embodiment of this disclosure, a variable power and response time brown-out-reset apparatus may comprise: a comparator having a first input, a second input and an output; a comparator bias circuit coupled to the comparator, wherein the comparator bias circuit is adapted to programmably change the comparator speed and power usage characteristics; a programmable voltage buffer having an output and an input, wherein the output of the programmable voltage reference is coupled to the first input of the comparator and the input is coupled to an external voltage reference, wherein the programmable voltage buffer has programmable speed and power characteristics; a power source voltage divider having an input and an output, wherein the input of the power source voltage divider is coupled to a power source and the output of the power source voltage divider is coupled to the second input of the comparator, wherein the power source voltage divider has programmable speed and power characteristics; and a n-bit wide power control bus coupled to the comparator bias circuit, the programmable voltage buffer and the power source voltage divider, wherein the speed and power usage characteristics of the comparator, the programmable voltage buffer and the power source voltage divider are programmed over the n-bit wide power control bus; wherein if a reference voltage from the output of the programmable voltage buffer is greater than a divided power source voltage from the output of the power source voltage divider, then a logic level changes on the output of the comparator.

BRIEF DESCRIPTION OF THE DRAWINGS

A more complete understanding of the present disclosure thereof may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

Figure 1:
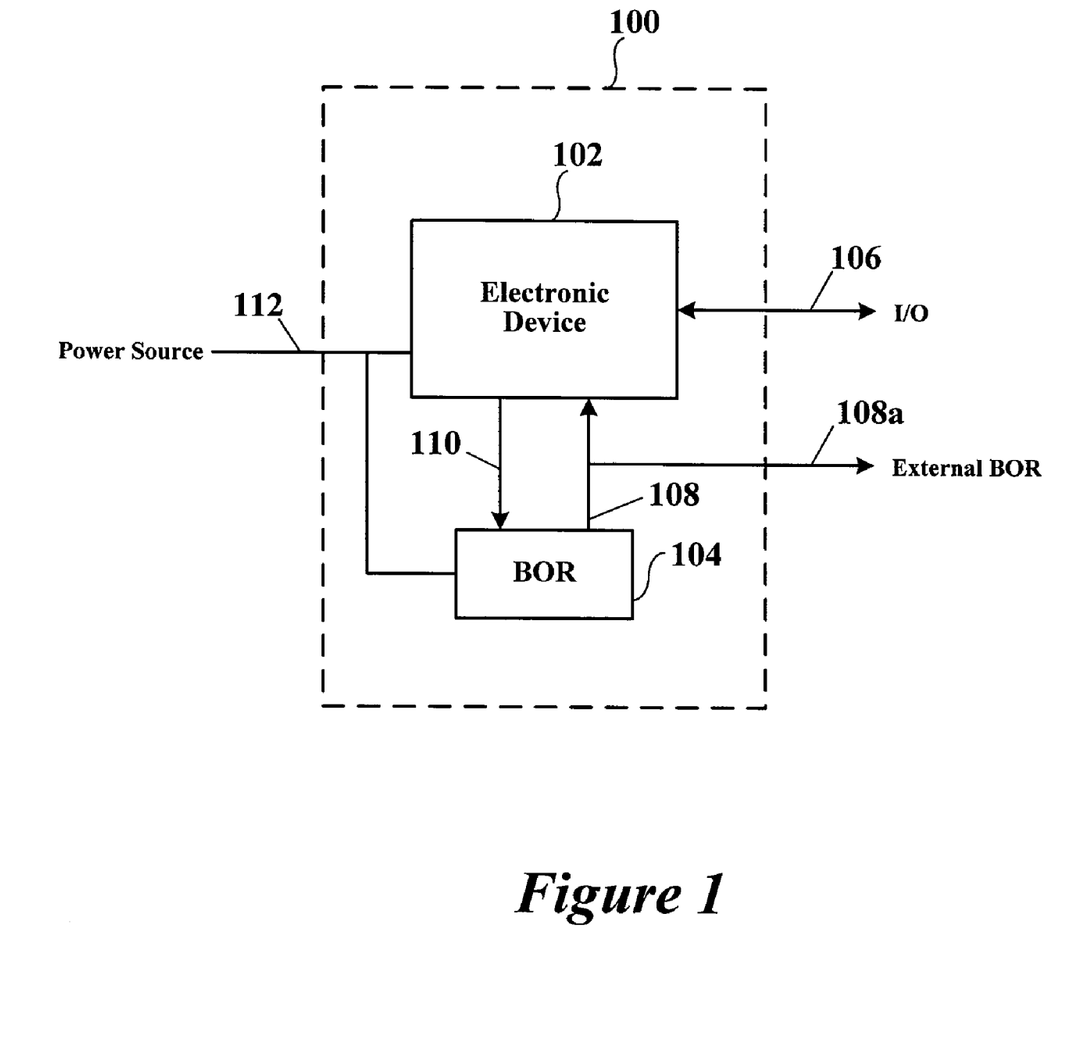
FIG. 1 illustrates a schematic block diagram of a semiconductor integrated circuit comprising an electronic device and a brown-out-reset (BOR) circuit associated with the electronic device.

Referring to FIG. 1, depicted is a schematic block diagram of a semiconductor integrated circuit comprising an electronic device and a brown-out-reset (BOR) circuit associated with the electronic device. An electronic device 102, e.g., microprocessor, microcontroller, digital signal processor (DSP), programmable logic array (PLA), application specific integrated circuit (ASIC), analog device, mixed-mode analog-digital device, etc., and a brown-out-reset (BOR) circuit 104 may be fabricated on a semiconductor integrated circuit 100. The electronic device 102 has inputs and outputs (I/O) 106 for interfacing with an electronic system (not shown). The electronic device 102 and the BOR circuit 104 may be powered from a power source 112 (not shown). The BOR circuit 104 may monitor the voltage value of the power source 112 and may send a BOR signal 108 to the electronic device 102 when the voltage value of the power source 112 drops below a certain minimum voltage value. The electronic device 102 may control the operating characteristics of the BOR circuit 104 over a power control bus 110. An external BOR signal 108*a* may be available for use with other integrated circuits in an electronic system.

Figure 2:
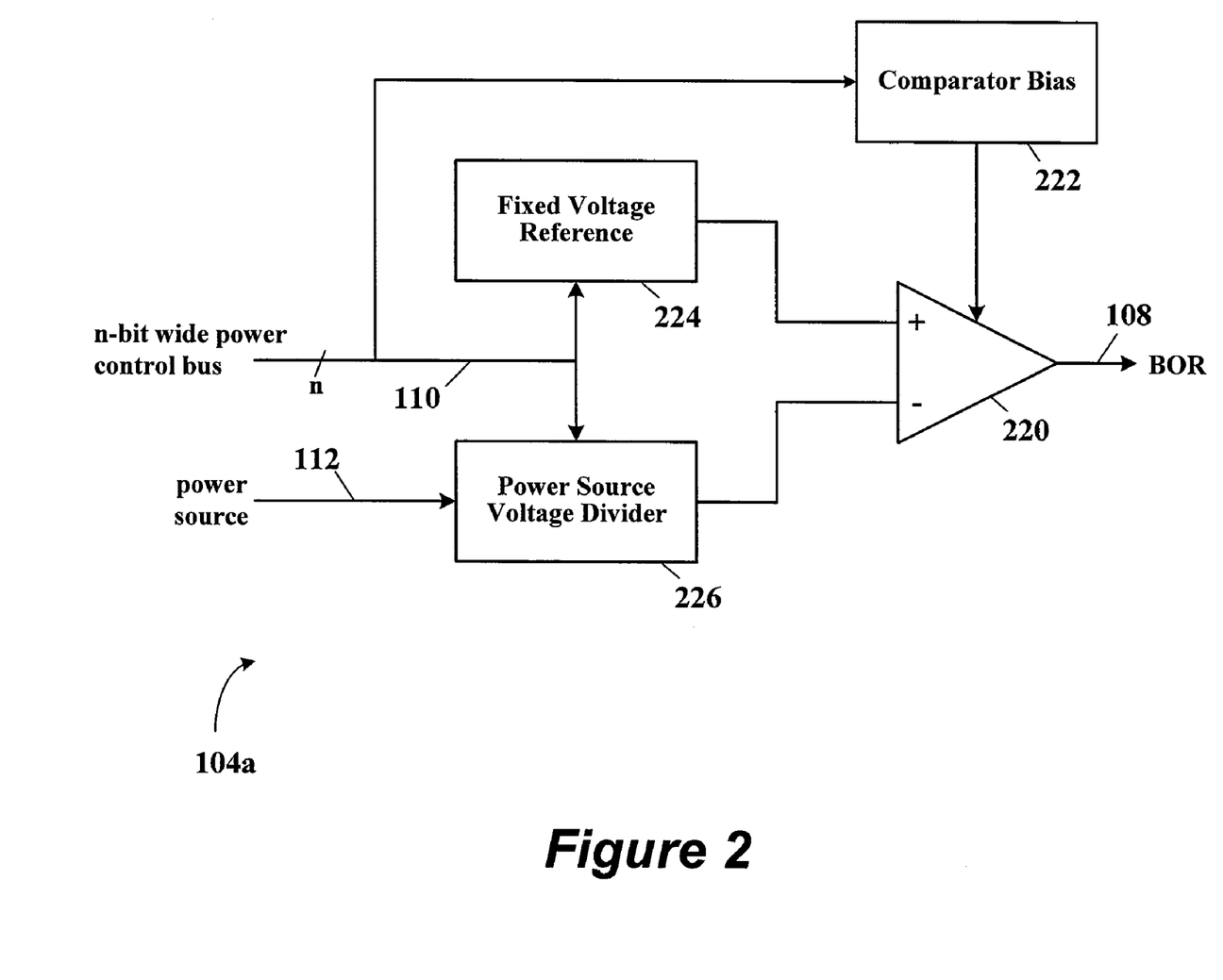
FIG. 2 illustrates a more detailed schematic block diagram for the BOR circuit of FIG. 1, according to a specific example embodiment of this disclosure.

Referring to FIG. 2, depicted is a more detailed schematic block diagram for the BOR circuit of FIG. 1, according to a specific example embodiment of this disclosure. A BOR circuit 104*a* may comprise a comparator 220, a comparator bias circuit 222, a fixed voltage reference 224 and a power source voltage divider 226, e.g., resistor network. The power source voltage divider 226 may reduce (divide) the voltage value of the power source 112 at its output and that output may be coupled to an input (−) of the comparator 220. The fixed voltage reference 224 may be coupled to another input (+) of the comparator 220 so that when the divided voltage value of the power source 112 is less than the voltage from the fixed voltage reference 224, the BOR signal 108 (output of the comparator 220) will change logic levels, e.g., from a low to a high logic level or visa-versa. Once the BOR signal 108 changes logic levels, the electronic device 102 may initiate a brown-out-reset program sequence, e.g., a controlled halt of a running program.

An n-bit wide power control bus 110 may be used for controlling the operating characteristics and power consumption of the BOR circuit 104*a*. When the BOR circuit 104*a* is operating with a fast electronic device 102, the BOR circuit 104*a* may be configured with a configuration signal(s) over the n-bit wide power control bus 110 to have fast response to changing voltage values, e.g., the comparator 220 may be biased for faster operation by the comparator bias circuit 222. Similarly, the fixed voltage reference 224 may be biased at a higher current draw, e.g., for greater voltage precision and/or lower drive impedance (faster RC time constant). Likewise, the power source voltage divider 226 may use lower value resistors for a lower drive impedance. This configuration gives the BOR circuit 104*a* faster signal 108 output response to a power source 112 brown-out condition, but with a commensurate increase in power consumption.

When the BOR circuit 104*a* is operating with an electronic device 102 that my be in a low power or sleep mode, the BOR circuit 104*a* may be configured with the configuration signal (s) over the n-bit wide power control bus 110 to have lower power consumption and may be slower response to changing voltage values, e.g., the comparator 220 may be biased for lower power operation by the comparator bias circuit 222. Similarly, the fixed voltage reference 224 may be biased at a lower current draw. Likewise, the power source voltage divider 226 may use higher value resistors for less power consumption from the power source 112. This lower power configuration results in the BOR circuit 104*a* having lower power consumption.

It is contemplated and within the scope of this disclosure that the n-bit wide power control bus 110 may have a plurality ($2^n$) of power/speed configuration settings ranging from low power and slower response time to fastest response time and higher power usage.

Figure 3:
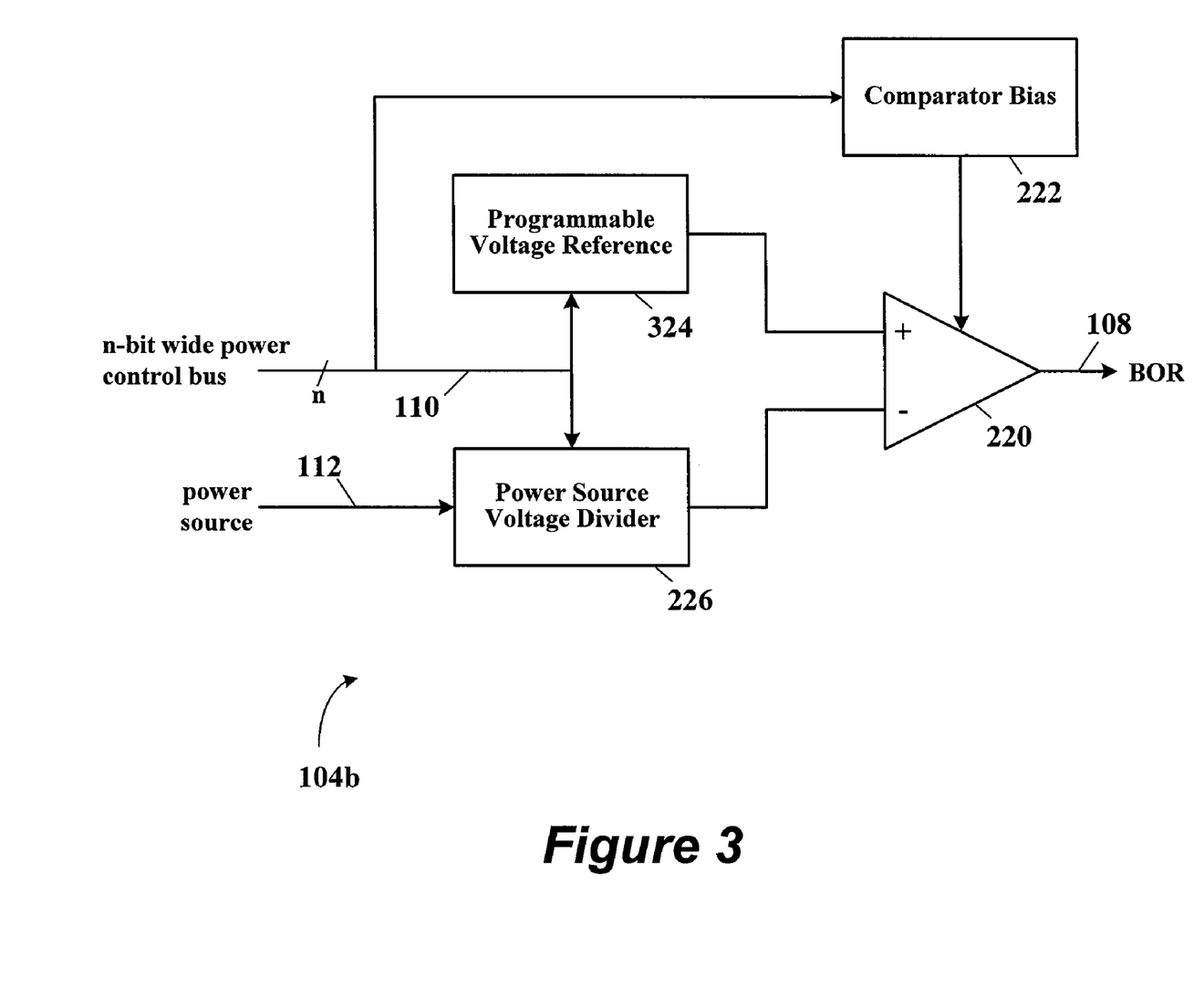
FIG. 3 illustrates a more detailed schematic block diagram for the BOR circuit of FIG. 1, according to another specific example embodiment of this disclosure.

Referring to FIG. 3, depicted is a more detailed schematic block diagram for the BOR circuit of FIG. 1, according to another specific example embodiment of this disclosure. A BOR circuit 104*b* may comprise a comparator 220, a comparator bias circuit 222, a programmable voltage reference 324 and a power source voltage divider 226, e.g., resistor network. The power source voltage divider 226 may reduce (divide) the voltage value of the power source 112 at its output and that output may be coupled to an input (−) of the comparator 220. The programmable voltage reference 324 may be coupled to another input (+) of the comparator 220 so that when the divided voltage value of the power source 112 is less than the voltage from the programmable voltage reference 324, the BOR signal 108 (output of the comparator 220) will change logic levels, e.g., from a low to a high logic level or visa-versa. Once the BOR signal 108 changes logic levels, the electronic device 102 may initiate a brown-out-reset program sequence, e.g., a controlled halt of a running program. A particular reference voltage value from the programmable voltage reference 324 may be set by a program command over the n-bit wide power control bus 110. Having a programmable reference voltage value allows different power source voltage levels to be used to power the electronic device 102 and still have a brown-out-reset function according to the teachings of this disclosure.

An n-bit wide power control bus 110 may be used for controlling the operating characteristics, e.g., operating speed and reference voltage value, and power consumption of the BOR circuit 104b. When the BOR circuit 104b is operating with a fast electronic device 102, the BOR circuit 104b may be configured with a configuration signal(s) over the n-bit wide power control bus 110 to have fast response to changing voltage values, e.g., the comparator 220 may be biased for faster operation by the comparator bias circuit 222. Similarly, the programmable voltage reference 324 may be biased at a higher current draw, e.g., for greater voltage precision and/or lower drive impedance (faster RC time constant). Likewise, the power source voltage divider 226 may use lower value resistors for a lower drive impedance. This configuration gives the BOR circuit 104b faster signal 108 output response to a power source 112 brown-out condition, but with a commensurate increase in power consumption.

When the BOR circuit 104b is operating with an electronic device 102 that my be in a low power or sleep mode, the BOR circuit 104b may be configured with the configuration signal(s) over the n-bit wide power control bus 110 to have lower power consumption and may be slower response to changing voltage values, e.g., the comparator 220 may be biased for lower power operation by the comparator bias circuit 222. Similarly, the programmable voltage reference 324 may be biased at a lower current draw, and/or a lower reference voltage value. Likewise, the power source voltage divider 226 may use higher value resistors for less power consumption from the power source 112. This lower power configuration results in the BOR circuit 104b having lower power consumption and/or brown-out reset at different selectable voltage levels.

It is contemplated and within the scope of this disclosure that the n-bit wide power control bus 110 may have a plurality ($2^n$) of power/speed/voltage reference configuration settings ranging from low power and slower response time to fastest response time and higher power usage, and, additionally, selectable brown-out-reset voltage levels.

Figure 4:
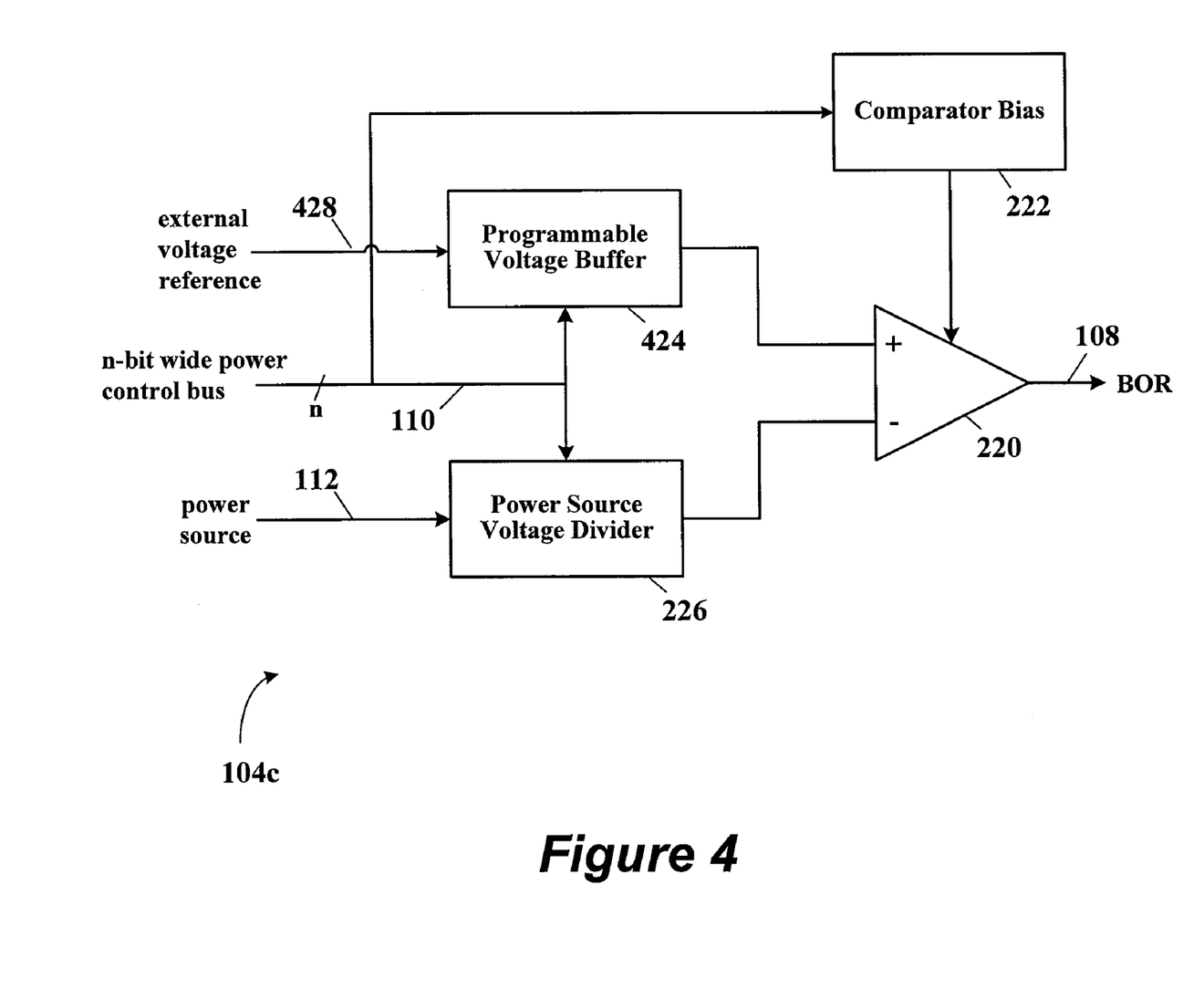
FIG. 4 illustrates a more detailed schematic block diagram for the BOR circuit of FIG. 1, according to yet another specific example embodiment of this disclosure.

Referring to FIG. 4, depicted is a more detailed schematic block diagram for the BOR circuit of FIG. 1, according to yet another specific example embodiment of this disclosure. A BOR circuit 104c may comprise a comparator 220, a comparator bias circuit 222, a programmable voltage buffer 424 and a power source voltage divider 226, e.g., resistor network. The power source voltage divider 226 may reduce (divide) the voltage value of the power source 112 at its output and that output may be coupled to an input (−) of the comparator 220. The programmable voltage buffer 424 may be coupled to another input (+) of the comparator 220 so that when the divided voltage value of the power source 112 is less than the voltage from the programmable voltage buffer 424, the BOR signal 108 (output of the comparator 220) will change logic levels, e.g., from a low to a high logic level or visa-versa. Once the BOR signal 108 changes logic levels, the electronic device 102 may initiate a brown-out-reset program sequence, e.g., a controlled halt of a running program. An external reference voltage 428 value may be programmed to a desired reference voltage with the programmable voltage buffer 424 by a program command over the n-bit wide power control bus 110. Having a programmable reference voltage value allows different power source voltage levels to be used to power the electronic device 102 and still have a brown-out-reset function according to the teachings of this disclosure. Using an external voltage reference 428 may be more cost effective and/or allow lower power consumption of the BOR circuit 102.

An n-bit wide power control bus 110 may be used for controlling the operating characteristics, e.g., operating speed and reference voltage value, and power consumption of the BOR circuit 104c. When the BOR circuit 104c is operating with a fast electronic device 102, the BOR circuit 104c may be configured with a configuration signal(s) over the n-bit wide power control bus 110 to have fast response to changing voltage values, e.g., the comparator 220 may be biased for faster operation by the comparator bias circuit 222. Similarly, the programmable voltage buffer 424 may be biased at a higher current draw, e.g., for greater voltage precision and/or lower drive impedance (faster RC time constant). Likewise, the power source voltage divider 226 may use lower value resistors for a lower drive impedance. This configuration gives the BOR circuit 104c faster signal 108 output response to a power source 112 brown-out condition, but with a commensurate increase in power consumption.

When the BOR circuit 104c is operating with an electronic device 102 that my be in a low power or sleep mode, the BOR circuit 104c may be configured with the configuration signal (s) over the n-bit wide power control bus 110 to have lower power consumption and may be slower response to changing voltage values, e.g., the comparator 220 may be biased for lower power operation by the comparator bias circuit 222. Similarly, the programmable voltage buffer 424 may be biased at a lower current draw, and/or a lower reference voltage value. Likewise, the power source voltage divider 226 may use higher value resistors for less power consumption from the power source 112. This lower power configuration results in the BOR circuit 104c having lower power consumption and/or brown-out reset at different selectable voltage levels.

It is contemplated and within the scope of this disclosure that the n-bit wide power control bus 110 may have a plurality ($2^n$) of power/speed/voltage reference configuration settings ranging from low power and slower response time to fastest response time and higher power usage, and additionally selectable brown-out-reset voltage levels.

It is contemplated and within the scope of this disclosure that a serial power control bus, e.g., one-wire bus where n=1, may be used instead of the aforementioned multi-bit n-bit wide power control bus 110 such that the operating characteristics of the BOR 104 may be serially programmed from either the electronic device 102 and/or an external programming source, e.g., external programming pin (not shown) on the integrated circuit 100. Implementation of a serial power control bus and/or a multi-bit n-bit wide power control bus 110 may be easily accomplished by one of ordinary skill in digital integrated circuit electronic design and having the benefit of the teachings of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A variable power and response time brown-out-reset apparatus, comprising:
    a comparator having a first input, a second input and an output;
    a comparator bias circuit coupled to the comparator, wherein the comparator bias circuit is programmable to change the comparator speed and power usage characteristics;
    a fixed voltage reference having an output, wherein the output of the fixed voltage reference is coupled to the first input of the comparator, wherein the fixed voltage reference is programmable to change the fixed voltage reference speed and power usage characteristics;
    a power source voltage divider having an input and an output, wherein the input of the power source voltage divider is coupled to a power source and the output of the power source voltage divider is coupled to the second input of the comparator, wherein the power source voltage divider is programmable to change the power source voltage divider speed and power characteristics; and
    a n-bit wide power control bus coupled to the comparator bias circuit, the fixed voltage reference and the power source voltage divider, wherein the speed and power usage characteristics of the comparator, the fixed voltage reference and the power source voltage divider are programmed over the n-bit wide power control bus;
    wherein when a reference voltage from the output of the fixed voltage reference is greater than a divided power source voltage from the output of the power source voltage divider then a logic level changes on the output of the comparator.

2. The apparatus according to claim 1, wherein the output of the comparator is used as a brown-out-reset signal.

3. The apparatus according to claim 1, wherein the output of the comparator is used as an external brown-out-reset signal.

4. The apparatus according to claim 1, further comprising an electronic device coupled to the output of the comparator, wherein when the logic level changes on the output of the comparator the electronic device goes into a brown-out-reset mode.

5. The apparatus according to claim 4, wherein the electronic device is selected from the group consisting of microprocessor, microcontroller, digital signal processor (DSP), programmable logic array (PLA), application specific integrated circuit (ASIC), analog device, and analog-digital mixed mode device.

6. The apparatus according to claim 5, wherein the electronic device, the comparator, the comparator bias circuit, the fixed voltage reference, the power source voltage divider and the n-bit wide power control bus are fabricated on a semiconductor integrated circuit.

7. The apparatus according to claim 1, wherein the speed and power usage characteristics of the comparator, the fixed voltage reference and the power source voltage divider are programmable from slow speed and low power to high speed and high power.

8. The apparatus according to claim 1, wherein there are $2^n$ programmable selections for the speed and power usage characteristics of the comparator, the fixed voltage reference and the power source voltage divider.

9. The apparatus according to claim 1, wherein the n-bit wide power control bus is one bit wide and the speed and power usage characteristics of the comparator, the fixed voltage reference and the power source voltage divider are serially programmed.

10. The apparatus according to claim 1, wherein the n-bit wide power control bus is one bit wide and the power source voltage divider is serially programmed.

11. A variable power and response time brown-out-reset apparatus, comprising:
    a comparator having a first input, a second input and an output;
    a comparator bias circuit coupled to the comparator, wherein the comparator bias circuit is programmable to change the comparator speed and power usage characteristics;
    a programmable voltage reference having an output, wherein the output of the programmable voltage reference is coupled to the first input of the comparator, wherein the programmable voltage reference is programmable to change the programmable voltage reference speed and power usage characteristics, and reference voltage values;
    a power source voltage divider having an input and an output, wherein the input of the power source voltage divider is coupled to a power source and the output of the power source voltage divider is coupled to the second input of the comparator, wherein the power source voltage divider is programmable to change the power source voltage divider speed and power characteristics; and
    a n-bit wide power control bus coupled to the comparator bias circuit, the programmable voltage reference and the power source voltage divider, wherein the speed and power usage characteristics of the comparator, the programmable voltage reference and the power source voltage divider are programmed over the n-bit wide power control bus;
    wherein when a reference voltage from the output of the programmable voltage reference is greater than a divided power source voltage from the output of the power source voltage divider then a logic level changes on the output of the comparator.

12. The apparatus according to claim 11, wherein the output of the comparator is used as a brown-out-reset signal.

13. The apparatus according to claim 11, wherein the output of the comparator is used as an external brown-out-reset signal.

14. The apparatus according to claim 11, further comprising an electronic device coupled to the output of the comparator, wherein when the logic level changes on the output of the comparator the electronic device goes into a brown-out-reset mode.

15. The apparatus according to claim 14, wherein the electronic device is selected from the group consisting of microprocessor, microcontroller, digital signal processor (DSP), programmable logic array (PLA), application specific integrated circuit (ASIC), analog device, and analog-digital mixed mode device.

16. The apparatus according to claim 15, wherein the electronic device, the comparator, the comparator bias circuit, the programmable voltage reference, the power source voltage divider and the n-bit wide power control bus are fabricated on a semiconductor integrated circuit.

17. The apparatus according to claim 11, wherein the speed and power usage characteristics of the comparator, the programmable voltage reference and the power source voltage divider are programmable from slow speed and low power to high speed and high power.

18. The apparatus according to claim 11, wherein there are $2^n$ programmable selections for the speed and power usage characteristics of the comparator, the programmable voltage reference and the power source voltage divider.

19. The apparatus according to claim 11, wherein the n-bit wide power control bus is one bit wide and the speed and power usage characteristics of the comparator, the programmable voltage reference and the power source voltage divider are serially programmed.

20. The apparatus according to claim 11, wherein the n-bit wide power control bus is one bit wide and the reference voltage value of the programmable voltage reference is serially programmed.

21. A variable power and response time brown-out-reset apparatus, comprising:
- a comparator having a first input, a second input and an output;
- a comparator bias circuit coupled to the comparator, wherein the comparator bias circuit is programmable to change the comparator speed and power usage characteristics;
- a programmable voltage buffer having an output and an input, wherein the output of the programmable voltage reference is coupled to the first input of the comparator and the input is coupled to an external voltage reference, wherein the programmable voltage buffer is programmable to chance the programmable voltage buffer speed and power usage characteristics;
- a power source voltage divider having an input and an output, wherein the input of the power source voltage divider is coupled to a power source and the output of the power source voltage divider is coupled to the second input of the comparator, wherein the power source voltage divider is programmable to change the power source voltage divider speed and power characteristics; and
- a n-bit wide power control bus coupled to the comparator bias circuit, the programmable voltage buffer and the power source voltage divider, wherein the speed and power usage characteristics of the comparator, the programmable voltage buffer and the power source voltage divider are programmed over the n-bit wide power control bus;

wherein when a reference voltage from the output of the programmable voltage buffer is greater than a divided power source voltage from the output of the power source voltage divider then a logic level changes on the output of the comparator.

22. The apparatus according to claim 21, wherein the output of the comparator is used as a brown-out-reset signal.

23. The apparatus according to claim 21, wherein the output of the comparator is used as an external brown-out-reset signal.

24. The apparatus according to claim 21, further comprising an electronic device coupled to the output of the comparator, wherein when the logic level changes on the output of the comparator the electronic device goes into a brown-out-reset mode.

25. The apparatus according to claim 24, wherein the electronic device is selected from the group consisting of microprocessor, microcontroller, digital signal processor (DSP), programmable logic array (PLA), application specific integrated circuit (ASIC), analog device, and analog-digital mixed mode device.

26. The apparatus according to claim 25, wherein the electronic device, the comparator, the comparator bias circuit, the programmable voltage buffer, the power source voltage divider and the n-bit wide power control bus are fabricated on a semiconductor integrated circuit.

27. The apparatus according to claim 21, wherein the speed and power usage characteristics of the comparator, the programmable voltage buffer and the power source voltage divider are programmable from slow speed and low power to high speed and high power.

28. The apparatus according to claim 21, wherein there are $2^n$ programmable selections for the speed and power usage characteristics of the comparator, the programmable voltage buffer and the power source voltage divider.

29. The apparatus according to claim 21, wherein the n-bit wide power control bus is one bit wide and the speed and power usage characteristics of the comparator, the programmable voltage buffer and the power source voltage divider are serially programmed.

30. The apparatus according to claim 21, wherein the programmable voltage buffer has a programmable voltage level on its output.

31. The apparatus according to claim 30, wherein the n-bit wide power control bus is one bit wide and the voltage level of the programmable voltage buffer is serially programmed.

* * * * *

UNITED STATES PATENT AND TRADEMARK OFFICE
CERTIFICATE OF CORRECTION

PATENT NO. : 7,589,568 B2 Page 1 of 1
APPLICATION NO. : 11/744365
DATED : September 15, 2009
INVENTOR(S) : Steedman et al.

It is certified that error appears in the above-identified patent and that said Letters Patent is hereby corrected as shown below:

Column 9, Line 30: The word "chance" should be deleted and replaced with --change--.

Signed and Sealed this

Twentieth Day of April, 2010

David J. Kappos
*Director of the United States Patent and Trademark Office*